United States Patent [19]

Huovila et al.

[11] Patent Number: 5,825,653
[45] Date of Patent: Oct. 20, 1998

[54] METHOD FOR OVERALL REGULATION OF A FORMER OF A PAPER MACHINE OR EQUIVALENT

[75] Inventors: Jyrki Huovila, Muurame; Jari Hämäläinen, Palokka; Petri Nyberg; Pekka Pakarinen, both of Jyväskylä, all of Finland

[73] Assignee: Valmet Corporation, Helsinki, Finland

[21] Appl. No.: 818,837

[22] Filed: Mar. 14, 1997

[51] Int. Cl.⁶ .................................................. G06F 19/00
[52] U.S. Cl. ............ 364/471.02; 162/252; 162/DIG. 10
[58] Field of Search .................... 364/148, 149, 364/152, 150, 471.01, 471.02, 148.03, 148.06, 578; 162/198, 252, 253, 262, 903, DIG. 10, 258, DIG. 11

[56] References Cited

U.S. PATENT DOCUMENTS

| | | | |
|---|---|---|---|
| 3,619,360 | 11/1971 | Persik | 162/258 |
| 3,666,621 | 5/1972 | Adams | 162/198 |
| 4,374,703 | 2/1983 | Lebeau et al. | 162/253 |
| 4,500,968 | 2/1985 | Bialkowski | 364/471 |
| 4,680,089 | 7/1987 | Aral et al. | 162/198 |
| 4,707,779 | 11/1987 | Hu | 364/148 |
| 4,748,400 | 5/1988 | Typpo | 324/61 R |
| 5,071,514 | 12/1991 | Francis | 162/259 |
| 5,381,341 | 1/1995 | Herrda et al. | 364/471 |
| 5,490,905 | 2/1996 | Huovila et al. | 162/212 |

FOREIGN PATENT DOCUMENTS

| | | | |
|---|---|---|---|
| 0541457 | 5/1993 | European Pat. Off. | D21G 9/00 |
| 81848 | 8/1990 | Finland | D21F 1/00 |
| 85731 | 12/1990 | Finland | D21F 1/00 |

OTHER PUBLICATIONS

"Mathematical Modelling and Simulation of Fluid Flows in the Headbox of Paper Machines", Jari Hamalainen, University of Jyvaskyla. Department of Mathematics. May 1993, pp. 1, 10, 11–97, 100, 101.

*Primary Examiner*—Paul P. Gordon
*Assistant Examiner*—Steven R. Garland
*Attorney, Agent, or Firm*—Steinberg & Raskin, P.C.

[57] ABSTRACT

A method for continuous overall regulation of a former of a paper or board machine or equivalent in which a physical fluid flow model of the drainage and the flow state of the pulp suspension flow is formed. The model is solved by making use of the data on the geometry of the former and initial and boundary conditions necessary for a solution to the model. The difference between the simulated state, which has been obtained as the solution of the physical flow model, and the state adopted as the target is determined as the cost function, wherein the target state is determined by means of the quality requirements of the paper and possibly by means of the costs of operation and the runnability of the paper machine. The cost function is optimized and, thus, optimal regulation values and set values are obtained for the regulation devices and/or actuators of the former in view of the given cost function. After the optimization has been carried out in the preceding stage, the former's regulation devices and/or actuators are given new optimal regulation and set values.

24 Claims, 3 Drawing Sheets

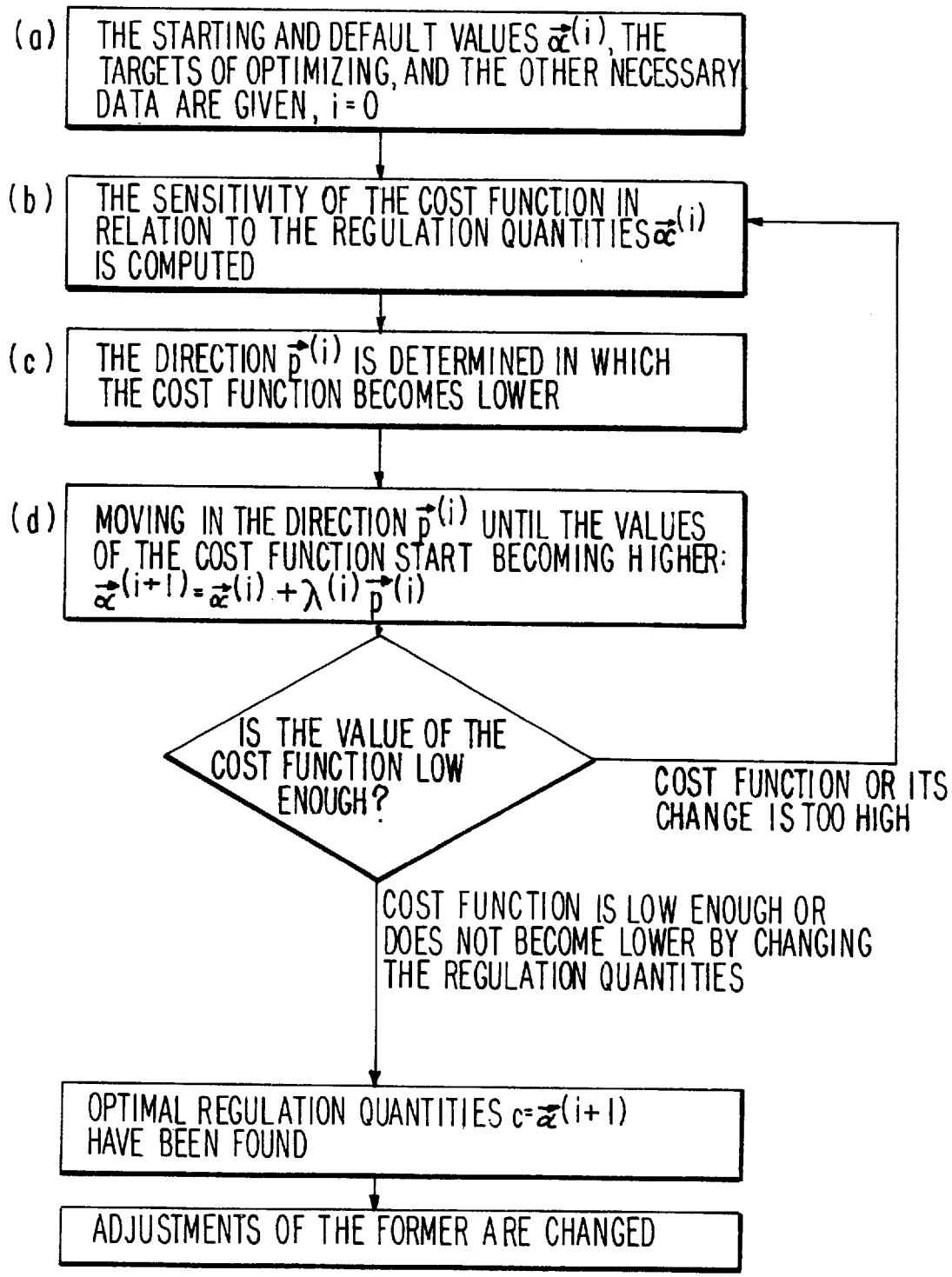

METHOD FOR OVERALL REGULATION OF A FORMER OF A PAPER MACHINE OR EQUIVALENT

FIELD OF THE INVENTION

The present invention relates to a method for continuous overall regulation of a former of a paper or board machine or equivalent, and more particularly, a method for optimizing the overall regulation of a former.

In the following, when a paper machine and papermaking technology are spoken of, it should be emphasized that it is considered that these terms and, at the same time the scope of the invention, also include the manufacture of board and, where applicable, also pulp machines.

BACKGROUND OF THE INVENTION

As is known from the prior art, in papermaking technology, a pulp suspension jet is fed out of the slice opening of a headbox onto a forming wire of a former part or into a gap between wires, which is called "forming gap". Formers known from the prior art are fourdrinier formers and twin-wire formers. The twin-wire formers can be divided further into gap formers and hybrid formers. In gap formers, the pulp suspension jet discharged from the headbox is fed directly into a forming gap defined between a pair of forming wires, and in hybrid formers, a single-wire initial portion is used before the twin-wire portion of the forming zone.

The scope of the method of the present invention includes various forming parts or formers of paper machines. Recently, however, twin-wire formers have largely replaced the single-wire fourdrinier formers, and the advantages and the objectives of the method of the present invention are accomplished to the greatest extent expressly in twin-wire formers.

In the formers of paper machines, a number of different forming members are employed. A principal objective of these members is to produce a compression pressure and pressure pulsation in the fibrous layer that is being formed, by means of which pressure and pulsation the draining of water out of the web that is being formed is promoted and, at the same time, the formation of the web is improved. Such forming members include various forming shoes, which are usually provided with a curved ribbed deck and over which the forming wires placed one above the other and the web placed between the wires are curved. In the area of these forming shoes, water is drained through the wire placed at the side of the outside curve by the effect of its tightening pressure, and this draining of water is aided further by a field of centrifugal force. Draining of water also takes place through the wire placed at the side of the inside curve, which draining is generally enhanced by means of a vacuum present in a chamber in the forming shoe. The ribbed deck of the forming shoe produces the pressure pulsation which both promotes the dewatering and improves the formation of the web.

Further, prior art forming members include what is called loading-element units, through which two wires placed one opposite to the other run as a straight or curved run. In the prior art loading-element units, inside the loop of one of the wires there is a pressure loading unit, and inside the loop of the opposite wire, a dewatering unit provided with a set of guide and dewatering ribs is arranged. As is known from the prior art, the loading-element unit is usually placed on the fourdrinier wire portion so that the loading-element unit is preceded by a single-wire portion having a considerable length. In the single-wire portion, a substantial amount of draining of water takes place before the web runs as a straight run in the plane of the fourdrinier wire through the loading-element unit.

The general object of the present invention is further development of the prior art so that, by means of a paper machine, paper having better quality properties can be produced more economically, vis-a-vis current quality properties of paper. As is well known, for example because of new printing methods, the quality requirements imposed on paper have become stricter and the requirements imposed on the economy of a paper machine have become ever higher. In the papermaking process, the former is a unit which has an important role and whose operation, for its part, determines the quality properties of the paper and the economy of the process.

A starting point of the present invention has been the constant increase in the computing and data processing capacity of computers and the lowering of the cost of this capacity so that, for example in the regulation of a paper machine, it is possible to introduce novel applications which were fully impossible earlier because of limitations of the capacity of computers and/or because of the cost of this capacity.

Besides on the above increased computing and data processing capacity and reduced costs of computers, the present invention is partially also based on mapping work carried out by the current assignee recently in the field of the flows and draining of paper stock suspension.

Another starting point of the present invention is the method for continuous overall regulation of the headbox of a paper machine described in the current assignee's U.S. patent application Ser. No. 08/634,465, incorporated by reference herein.

OBJECTS AND SUMMARY OF THE INVENTION

It is an object of the present invention to further develop systems of regulation of paper machines, and in this connection it is a specific object of the invention to develop and to modify the system of regulation of a headbox described in the above-referenced U.S. patent application so that the scope of application of the general inventive ideas suggested in that application can also be extended to the regulation of formers of paper machines and to optimization of the operation of such formers.

Between the present invention and the invention concerning the system of regulation of a headbox described in the above-referenced U.S. patent application, there are also mutual effects of synergism, owing to which it is possible to raise the standard of papermaking technology to a substantially higher level. In this regard, the overall headbox regulation system could be implemented in combination with the overall former regulation system in accordance with the invention to optimize the papermaking process.

It is another important object of the invention to provide a system of regulation of formers by whose means it is possible to make changes of paper grades taking place in a paper machine substantially quicker than previously possible. In the prior art, a change of paper grade takes a considerable period of time, typically from ten minutes to hours, which has a substantial effect on the operating time ratio and on the overall efficiency of the paper machine.

In view of achieving the objects stated above and others, the invention is mainly characterized in that the method comprises a combination of the following steps:

(a) a physical fluid flow model of the pulp suspension flow in the former part to be regulated is formed;

(b) the physical fluid flow model is solved to obtain a simulated state, or simulated flow state, by making use of the data on the geometry of the former and of other initial values and/or boundary conditions necessary for a solution of the flow model;

(c) the difference between the simulated state, which has been obtained as the solution of the flow model, and the state adopted as the target is determined as the cost function, wherein the target state is determined by means of the quality requirements of the paper and possibly by means of the costs of operation and/or the runnability of the paper machine;

(d) the cost function is optimized and, thus, optimal regulation values and set values are obtained for the instrumentation devices, regulation devices and/or actuators of the former in view of the given cost function; and (e) after the optimization has been carried out in the preceding stage, the former's instrumentation devices, regulation devices and/or actuators are given new optimal regulation and set values.

In accordance with the invention, it is possible to accomplish a system of optimization of the regulation parameters of the former part of a paper machine. This system is based on a mapping of the draining process that produces the structure of the paper that is being dewatered, in particular of the flow field of the process, by means of a physical model. Above this model in the system of regulation in accordance with the present invention, an optimizing system of regulation operates, by whose means all of the regulation parameters of the former part are regulated by means of overall regulation, such as the vacuum levels of the forming rolls in the former, the operation of loading-element boxes, the operation of forming shoes, and/or the operation of vacuum flatboxes, the positions of the forming rolls and/or forming ribs in the former, and the adjustment of the loading forces and/or the positions of the water-draining elements, the tensions of the forming wires, and/or retention and its profiling, as well as other parameters that affect the web formation and the draining of water taking place out of the web in the former.

The method of regulation in accordance with the invention does not necessarily require any direct measurements in the wire part. Such measurements in the wire part may of course be implemented in conjunction with the invention.

It is a substantial advantage of the invention that, based on the model that is applied, in real time, the system of regulation of the invention based on the physical model "knows" what is taking place in the wire part and what is the state of operation of the wire part. Further, the model that is applied in the invention "predicts" what will take place within the wire and what kind of a fiber mesh is being formed. Thus, by means of the model-based regulation in accordance with the invention, it is possible to enhance the control of paper quality and the operation of the former and to reduce the costs of operation continuously and as an overall control and regulation.

In particular in situations of change of grade in a paper machine, the present invention provides the advantage that by means of the model, it is possible to predict new optimal regulation values for the future situation, i.e., for the paper grade to be run next. In this manner, the time taken by the change of grade can be reduced decisively, and the operating time ratio and the overall efficiency of the paper machine can be increased substantially. In this connection, a physical fluid flow model for a grade of paper different than the grade being produced from the pulp suspension flow is formed so that optimal regulation values and set values are obtained for the new grade of paper and the operation and/or position of, for example, the water draining elements of the former are adjusted accordingly.

The system of regulation of the present invention and the system of regulation of a headbox of a paper machine, based on mapping and described in U.S. patent application 08/634,465, have the mutual advantage of synergism that, when the system of regulation of the '465 application is employed together with the system of regulation of the present invention, owing to the system of regulation of the headbox, the system of regulation of the present invention precisely knows the nature of the discharge jet that comes from the headbox, and in this respect the parameters of the model in accordance with the present invention can be set in compliance with the factual situation of operation of the former.

If necessary, in connection with the present invention, it is possible to apply direct measurement of retention, or alternatively the retention is obtained from the model that is applied in the present invention.

Generally, the present invention is applied most advantageously so that the cross-direction profiles of the paper web, such as the basis weight profiles and the fiber orientation profiles, are controlled by means of the headbox by making use of conventional systems of regulation of the headbox and/or of regulation by means of dilution and/or, particularly favorably, by making use of the overall system of regulation of the headbox based on mapping and described in the '465 application. However, the scope of the invention does not exclude embodiments in which cross-direction profiling of the web, such as profiling of water draining pressure and/or of retention, is also carried out by means of the former while, if necessary, also making use of the system of regulation in accordance with the present invention and of the optimization carried out by the system.

The system of regulation of the former of a paper machine that applies the method of the present invention is based on a physical model starting in particular from equations of fluid dynamics. The physical flow equations of the model and possible other, corresponding equations are solved in the geometry of the former that is being regulated on the basis of the boundary conditions given by the measurements.

Further, the data on the state of the flow coming from the headbox to the former (velocity, consistency, turbulence) are required. For fixing the parameters of the model, if necessary, measurements of the draining of water in the former and basis weight profiles and fiber orientation profiles measured in the paper web are utilized. This data is arranged so that the boundary conditions necessary for a solution of the model formed by the flow equations and equivalent can be determined unequivocally. The solution of the flow equations and equivalent is carried out by means of a computer of high computing capacity by using numerical solution methods, such as known finite element methods (EM) and finite difference methods (FDM). By means of the solvable physical flow model fixed by initial values and boundary conditions, the new regulation values optimal in relation to the pre-determined cost function are predicted. This is carried out by means of known optimization methods. The control set point values determined by the computed optimal flow conditions are set to the necessary regulation devices or actuators of the former, such as the actuators that regulate the vacuums in the suction rolls and/or suction boxes and the wire tensions. This procedure is repeated with a time period which is short enough to ensure the quality of produced paper in consideration of the circumstances.

The continuous system of regulation of the former of a paper machine that applies the method of the present invention has sufficiently accurate knowledge of the state of the former, in particular of the flow state, based on the physical model, which is solved by making use of the data on the geometry of the former and of other initial and boundary conditions necessary for the solution of the model. The system of regulation that applies the invention seeks the best possible regulation and set values for the actuators of the former in relation to the given cost function. The cost function to be optimized is, as a solution of the model, the difference between the flow state obtained on the basis of measurements of quality of the paper, of the state and measurements of the instrumentation and of the costs of operation and the target state that meets the requirements of quality and costs. The target state of the former is determined by means of the requirements of quality of the paper, which requirements depend on the flows and equivalent in the headbox and in the former, and, if necessary, also by means of the costs of operation of the paper machine and the runnability of the paper machine.

The system of regulation that makes use of the method of the present invention knows the effects of the regulation quantities on the flow in the former and, thus, also on the properties of the paper on the basis of the physical model. Thus, the system of regulation finds the best possible regulation and set values by means of optimizing and flow computing, usually without experimentally established responses or without having to slow down or to attenuate the system of regulation of the former by means of long time constants and low amplification coefficients, which is necessary in the prior art regulation systems. The optimal change computed by means of the flow model includes the overall changes produced by the operations of the actuators in the state of the former. In such a case, the change taking place as a result of optimizing is far more reliable than in the prior art systems of regulation, and as a result of this, an optimal change can be carried out as a single operation. This makes the reaching of optimal quality considerably quicker in paper grade and other changes and reduces the overall costs.

The flow model of a former is based on the basic laws of fluid dynamics, i.e., on conservation laws (mass, momentum, energy, angular momentum) and/or on simplified equations derived from same, whose numerical solution is possible by means of a computer having a sufficiently high processing capacity. The initial and boundary conditions of the flow model are on-line or laboratory measurements and information provided by the operator, for example, concerning the runnability and costs.

As the basis of the flow model it is possible to use a multi-phase model, in which there is an equation for the laws of conservation of momentum and mass for each phase (water, fibers, fillers, air) as well as interaction terms for the transfer of the momentum between the different phases.

In addition to the former flow model, in the present invention a transfer model is needed, which determines the relationship between the formed web after the former and the finished paper, depending on the operation of the press section and the dryer section and possible finishing devices, if any are present. Such a transfer model is known in itself, and it is used, for example, by the current assignee in the prior art headbox regulation systems.

The fixing of the parameters in the flow model of a former to be applied in the present invention must be carried out specifically for each machine and specifically for each paper grade to be produced. In such a case, both direct measurements from the former, such as measurements of the amount of water draining from the pulp suspension flow from which the paper s formed, and measurements carried out on the paper are required. The direct measurements are utilized for fixing the former model. All measurements that are economically possible in practice are generally useful, but it is easiest to measure draining of water from a number of different positions in the former. Further, it is necessary to know the state of the flow fed from the headbox to the former.

The interdependence between the web provided by the former flow model and the finished paper is fixed by means of measurements carried out from dried paper.

For the purpose of fixing the flow model, it is necessary to know the geometry of the former part (rolls, shoes, etc.) and the flow coming from the headbox, in order that the flow model should simulate the flows in the correct geometry. Normally, it is advisable to carry out verification measurements from the slice jet or from the paper, either during the starting of a flow-model based regulator or on-line constantly during operation of the machine.

In the flow model itself, as adaptable and variable parameters needed by the model, such parameters are often dependent on the flowing material, such as consistencies, viscosities, fiber and filler compositions and parameters that represent interactions of the different phases, etc. If these parameters vary within narrow limits only, they can also be fixed. For them, it is possible to make a model of their own, which is based on simple measurements of, e.g., temperature and consistency etc., which can be integrated in the process, or this information is requested from the operator.

The fixing of the transfer model to be fitted between a flow model and the quality properties of paper depends on what measurements can be carried out by means of the measurement devices of the paper machine on-line or in the laboratory. On-line profile measurement of basis weight and formation has been included in the prior art for a long time. Currently, the fiber orientation profile is measured as a routine operation in the laboratory of the paper mill, from where the data can be transferred to the use of the regulation system, for example, by means of a local network.

From the basis weight profile, information is obtained for regulation of the consistency profile, and the formation measurement reports on the turbulence level in the flow and on the fiber-flock interactions.

An optimal regulator based on a flow model gives set values to sub-regulators, such as to those PI or PID regulators that take care of the control of individual actuators, such as the control of vacuum levels and wire tension, if necessary, based on measurements of pressure and wire tension.

In order that the methods of optimization may be employed in the method of regulation in accordance with the present invention, the entirety of this method step of the invention must be formulated in the form of an assignment of mathematical optimization. In such a case, what is required is a model as accurate as possible for the physical phenomenon concerned, regulation quantities by whose means the optimum is sought, as well as the cost function that is minimized or maximized. In the invention, the regulation quantities may be, for example, vacuum levels, loadings of the water-draining members etc., such as positions of forming members. The search for optimal regulation values is carried out by means of a general optimizing method, such as in the commonly known assignments of optimization of shape and regulation (Optimal Shape Design), for example, by means of quasi-Newton's methods.

The cost function comprises at least the target properties of finished paper (formation and orientation level), but additionally it may also include components related to runnability and/or to consumption of energy. For example, if a certain quality level is set for the paper, it is possible to seek the lowest possible wire tension so that the required quality level (and cost level) are achieved and the wear of the wire is reduced. Different weights are used for different costs, for example, the quality of the paper is adopted as the most important factor, and/or, if the runnability can be improved and/or energy be saved without deteriorating the quality, this is carried out by means of the method of regulation of the present invention.

The efficiency of numerical flow computing and optimization have a direct effect on how quickly the regulation system can react to changes in the running situation. Therefore, in the present invention, both advanced numerical algorithms and the high processing capacity of computers are required in order that the regulation of the former by means of the flow model should be sufficiently rapid in practice. If necessary, the numerical computing can be accelerated by means of a number of techniques. The optimization is based on changes in the cost function (partial derivatives) in relation to the regulation quantities. Sensitivities in respect of each regulation quantity can be assumed to be independent from one another, in which case they can be computed in parallel by means of computers of several processors. The computing that is being carried out by each processor can be enhanced, for example, by means of the perturbation theory. A sensitivity analysis can be carried out in an environment of a linearized solution so that the flow model is solved by means of the perturbation theory (a sort of linearization). Even if the perturbation theory is not absolutely accurate for a non-linear flow model, it, however, predicts a change in the cost function in the correct direction, which is sufficient in the computing of the gradient of the cost function.

The sensitivity of a cost function in relation to the regulation quantities can also be solved by numerically solving a so-called adjoint state equation. Besides the solver of the flow model, this technique also requires a solver of the adjoint state equation. When the gradient (sensitivity) has been computed, elsewhere a real non-linear model is used for optimizing, in which case the optimizing proper is based on the real flow model, and inaccuracies produced by the perturbation theory or by the solution of the adjoint state equation are not seen in the final result of the optimization.

The parallel computing can be used both in the optimization in the manner described above and in numerical solution of the flow model. For example, in the finite element method, the numerical integration is carried out over every element, and at this stage information is not needed concerning the surrounding elements. Further, if the flow model of the former consists of a number of sub-models, the sub-models can be solved at the same time, and in between data are updated between the different processors (sub-models) depending on the solutions of the submodels. The computing can also be enhanced by dividing the optimization into parts. Certain regulation quantities are likely to have a greater effect on the quality of paper than others, in which case the most important parameters are optimized more frequently while reacting to the changes quickly, while other parameters are optimized less frequently.

An optimal regulation of the sort described above can be carried out while making use of a flow model also with some instructable (teachable) model, such as a neuro-network, or with some other statistical model. In such a case, the physical flow model is solved in the geometry with several different initial and boundary conditions in advance, and with these results, for example, a statistical model can be adapted or instructed for the flow state of the former and/or for the dependence of the cost function in respect of each individual former, its flow geometry or flow properties.

In the following, an exemplifying embodiment of the invention and an environment of application of same will be described in detail with reference to the illustrations in the figures in the accompanying drawing. However, the invention is in no way strictly confined to the details of the illustrated embodiments.

BRIEF DESCRIPTION OF THE DRAWINGS

The following drawings are illustrative of embodiments of the invention and are not meant to limit the scope of the invention as encompassed by the claims.

FIG. 3 illustrates a mode for carrying out a stage of optimizing included in the method of the invention as a flow diagram.

DETAILED DESCRIPTION OF THE PREFERRED EMBODIMENTS

Figure 1:
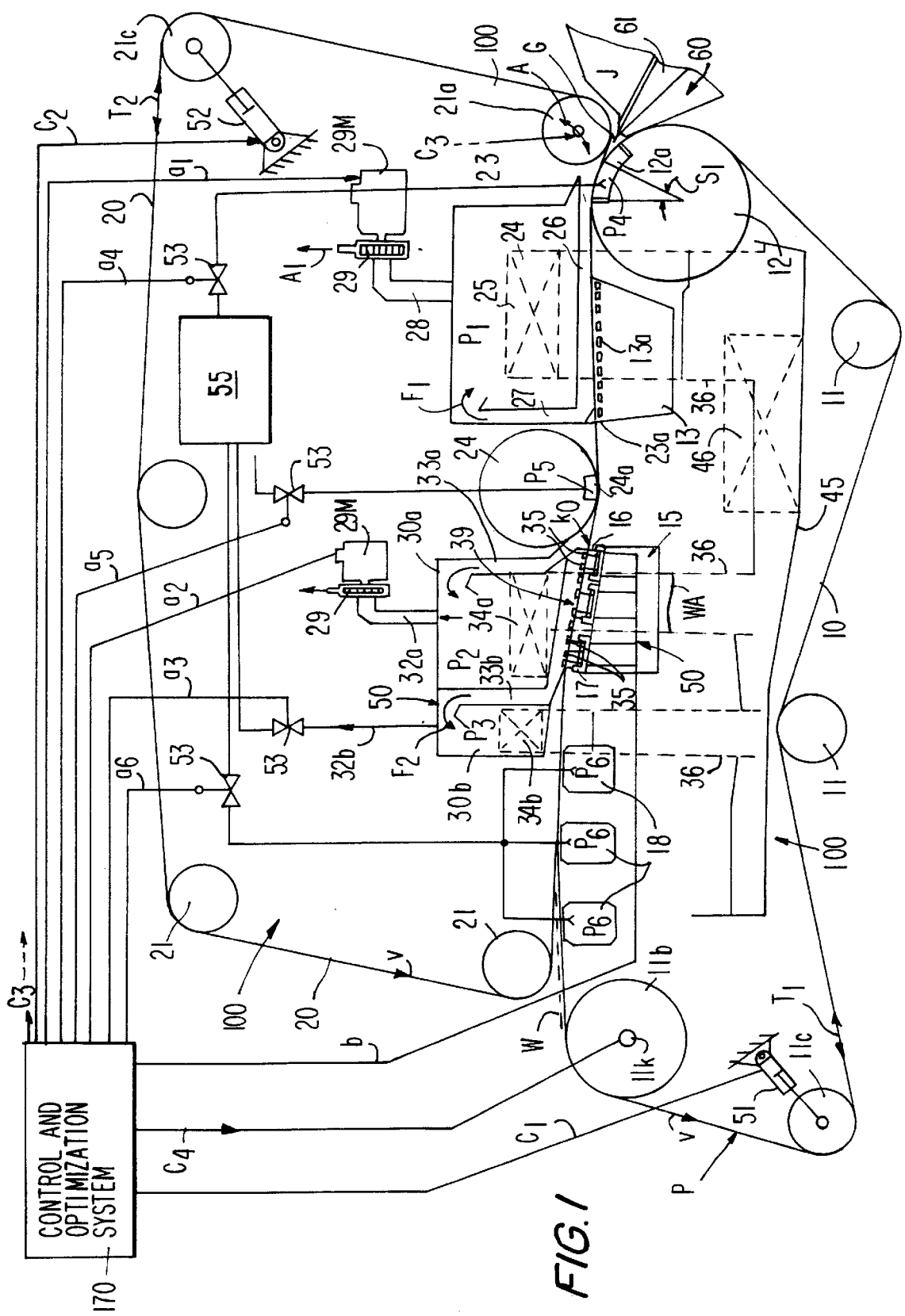
FIG. 1 is a schematic illustration, as an environment of application of the invention, of a former with its most important regulation devices and quantities.

Before the environment of application of the invention illustrated in FIG. 1 is described in more detail, it should be stated and emphasized that the former shown in FIG. 1 is just one environment of application of the invention, and attempts have been made to choose such a former for this environment of application in which there is a number as high as possible of actuators to be controlled by means of the regulation method in accordance with the present invention. It should also be emphasized that, of course, the invention can be applied in substantially different environments, most advantageously in twin-wire formers, but also in fourdrinier wire parts and in former sections of board and pulp machines.

A former 100 of a paper machine shown in FIG. 1 comprises a lower forming wire 10 guided in a loop by guide rolls 11,11a,11b,11c and by the first forming suction roll 12. The former 100 comprises an upper forming wire 20 guided in a loop by guide rolls 21,21c, by a breast roll 21a, and by a second forming roll 24. A pulp suspension jet J is fed through a slice duct 61 of a headbox 60 of the paper machine into a forming gap G defined by the forming wires 10 and 20, after which gap G, the twin-wire zone starts directly. A first forming-suction roll 12 is placed inside the loop of the lower wire 10, and the forming gap G is defined from above by the upper wire 20 running over the breast roll 21a. The position of the breast roll 21a is adjustable (represented schematically by arrow A), by means of which adjustability it is possible to act upon the magnitude of the sector $s_1$ of the twin-wire zone placed on a suction zone 12a of the forming roll 12 and thereby upon the web formation.

The twin-wire zone is in contact with the first forming roll 12 on the sector $s_1$, which is followed by the run of the wires 10,20 on which, inside the loop of the lower wire 10, there is a stationary forming shoe 13. The forming shoe 13 has a ribbed deck 13a with a large curve radius, whose curve center is at the side of the lower wire 10. A suction-deflector box 23 is arranged facing the forming shoe 13 and inside the loop of the upper wire 20. At a rear edge of the suction-deflector box 23, there is a deflector rib 23a operating against the inner face of the upper wire 20. The water that is drained from the web W through the upper wire 20 above and ahead of the forming shoe 13 is passed through a space 26 defined below the box 23 (and above the twin-wire forming zone) and through a suction-deflector duct 27 in the direction of arrow $F_1$, into an interior of the suction-deflector box 23. From the interior of the suction-deflector box 23, the water is removed through a duct 25 communicating with the barometric leg 36. A suitable vacuum level $p_1$ is maintained in the suction-deflector box 23 by means of a blower 29 operated by a motor 29M. The blower 29 communicates with the box 23 through the duct 28, and air is removed from the box in the direction of arrow $A_1$.

As shown in FIG. 1, an MB-unit is arranged after the second forming-suction roll 24 in the twin-wire zone. In the MB-unit 50, there is a water drain box 30 which communicates with the barometric leg 36 through a duct 34a, the water level in the leg 36 being denoted by WA. Below the water drain box 30, there is a stationary set of support ribs 35. The MB-unit 50 includes two successive water drain chambers 30a and 30b. The first chamber 30a is a suction-deflector chamber, whose suction duct 33a is opened above the first stationary support rib 35. The first chamber 30a communicates with a blower 29 operated by a motor 29M through a duct 32a. The water is drained from the chamber 30a through a duct 34a into the barometric leg 36. Below the first suction chamber 30a, there is a loading unit 15 which comprises loading ribs 16 loaded by means of pressures passed into hoses 17 and which are placed facing the gaps between the stationary support ribs 35. Through the gaps between the support ribs 35, water is drained through the upper wire 20 through a space 39 into a duct 33b and from the duct 33b further in the direction of the arrow $F_2$ into the second suction chamber 30b. The second suction chamber 30b communicates through a duct 32b and through a regulation valve 53 with a vacuum source 55 (negative pressure). From the chamber 30b, the water is drained through the duct 34b communicating with the barometric leg 36. The vacuum level $p_2$ and $p_3$ in each chamber 30a and 30b can be regulated independently from one another by means of valves 53. Through the suction-deflector duct 33a of the first chamber 30a, primarily the water is drained that is separated from the web W directly after the second suction roll 24.

Three successively arranged suction flatboxes 18 are arranged after the set of ribs 35/16 of the MB-unit 50 and inside the lower-wire loop 10. The web W is separated from the upper wire 20 in the area of the middle one of the suction flatboxes 18 and is guided to follow the lower wire 10. The web is separated from the lower wire 10 at a pick-up point P and passed on a pick-up fabric to the press section arranged after the former (not shown).

In FIG. 1, the system of regulation and optimization of the former 100 in accordance with the present invention is illustrated schematically as the block 170, which system will be described in more detail later. From this system 170, the regulation signals $a_1,a_2,a_3,a_4,a_5,a_6,b,c_1,c_2,c_3$ and $c_4$ which control the operation of the former 100 are obtained. By means of the regulation signals $a_1, \ldots, a_6$, the vacuum levels $p_1, \ldots, p_6$ of the forming members 23,30a,30b,12,24,18, respectively, are controlled. The regulation signal $a_1$ controls the speed of rotation of the motor 29M of the blower 29 associated with the suction-deflector box 23, and thus, by its means, it is possible to regulate the vacuum $p_1$ in the suction-deflector box 23. By means of the regulation signal $a_2$, the speed of rotation of the motor 29M of the second blower 29 associated with the MB-unit is controlled, and thus, by its means, it is possible to regulate the vacuum $p_2$ in the chamber 30a. By means of the regulation signal $a_3$, the regulation valve 53 is controlled, by whose means it is possible to regulate the vacuum $p_3$ in the chamber 30b communicating with the suction pump 55. By means of the regulation signal $a_4$, the regulation valve 53 is controlled, by whose means it is possible to act upon the vacuum level in the suction zone 12a of the forming roll 12. Similarly, by means of the regulation signal $a_5$, the vacuum level $p_5$ in the suction zone 24a of the forming roll 24 is affected. By means of the regulation signal $a_6$, the vacuum level $p_6$ in the suction flatboxes 18 is affected by means of the regulation valve 53. By means of the regulation signal b, the pressures of pressure media are regulated with which the loading ribs 16 in the unit 15 of the MB-unit 50, placed inside the forming wire 10, are loaded against the stationary ribs 35 placed above.

By means of the regulation signals $c_1$ and $c_2$, it is possible to act upon the wire 10,20 tensions $T_1$ and $T_2$. More particularly, by means of the regulation signal $c_1$, the pressures passed to the actuators, such as hydraulic cylinders 51, of the tensioning roll 11c are regulated, and in this way the tension $T_1$ of the lower wire 10 is affected. By means of the regulation signal $c_2$, the actuators, such as the pressures of the hydraulic cylinders 52, of the tensioning roll 21c of the upper wire 20 are affected, and in this way the tension $T_2$ of the upper wire 20 is regulated.

By means of the regulation signal $c_3$, the position of the breast roll 21 and, thus, the length of the curve sector $s_1$ at the initial end of the twin-wire zone, is affected (arrow A). By means of the regulation signal $c_4$, it is possible to act upon the speed v of the wires 10,20. This regulation of speed is represented by the connection of the regulation signal $c_4$ with the drive 11k of the roll 11b of the lower wire 10.

Figure 2:
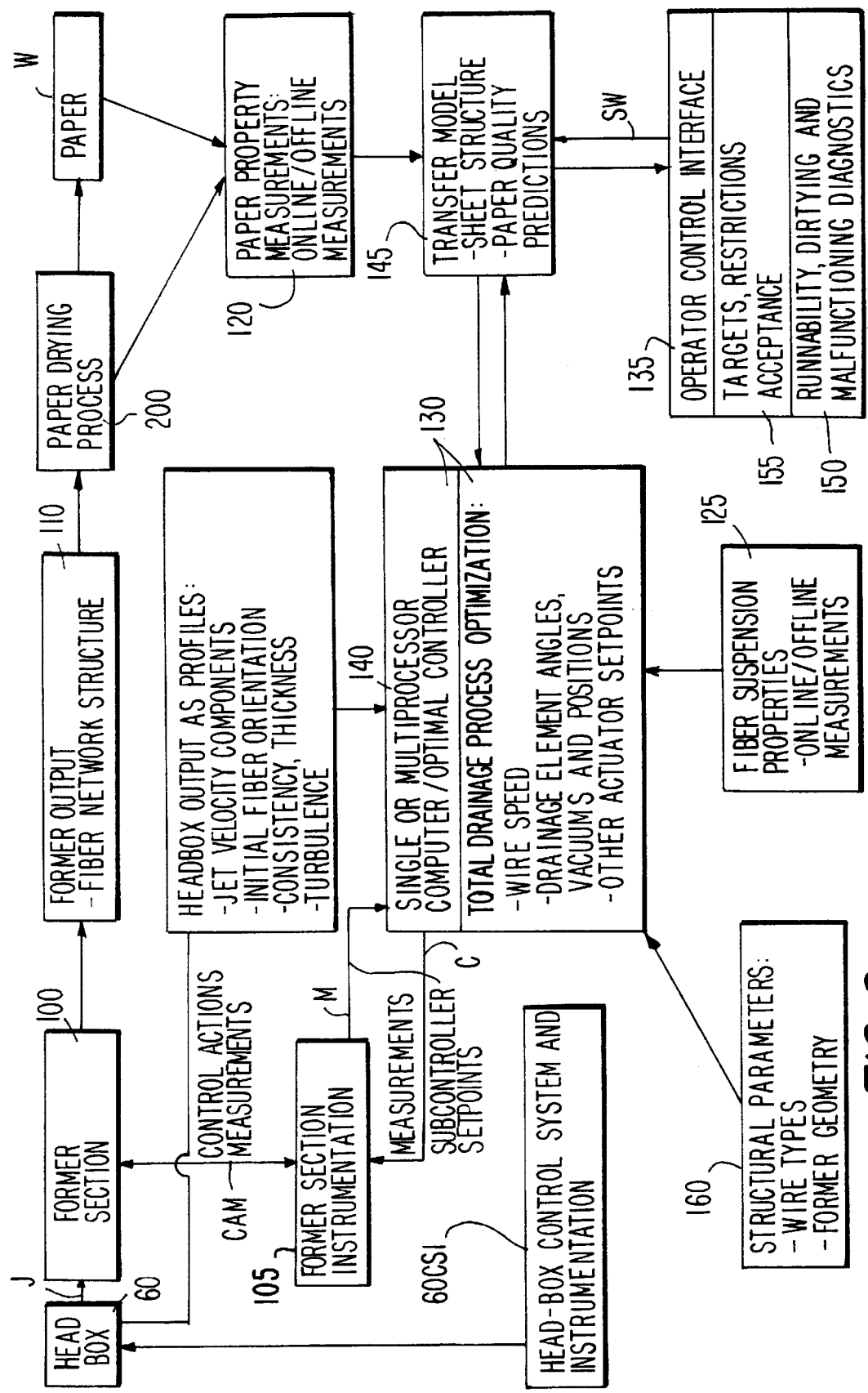
FIG. 2 illustrates a system of regulation that makes use of the method of the present invention as a block diagram showing the principal steps of the regulation system.

FIG. 2 is a schematic illustration as a block diagram of the construction of the system of regulation that carries out the method of the present invention. FIG. 2 shows the former 100, which was described above and which forms the fiber structure of the paper web W. The properties of the fiber structure are obtained by solving the flow model. The entire papermaking process after the former 100, which process is in itself known, is represented by the block 200. The block 200 represents the press section and the dryer section of the paper machine and also possible finishing devices. The transfer function of this process part 200, i.e., the transfer model mentioned above, is known, and it is utilized in the invention in the way that was described above and that will be described later. The properties of the finished paper W, such as quality properties and profiles, are measured before the reel-up by means of on-line or off-line measurements in themselves known, which is illustrated by the block 120. Block 120 communicates with the block 145, which illustrates the above transfer model of the headbox 60. The properties of the slice jet J are measured by means of on-line or off-line measurements or computed by means of the flow model of the headbox.

According to FIG. 2, the core of the system of regulation is the optimal controller 130, to which the target values or set values SW are provided in respect of the properties of the paper W and in respect of the production costs through the operator control interface 135. The former 100 is connected with its instrumentation, which is illustrated schematically by the block 105, from which the necessary (not always indispensable) measurement results M are obtained, which are passed to the optimal controller 130. From the optimal controller 130, the set values and the regulation quantities C are received for the instrumentation 105 of the former.

The optimal controller 130 includes a computer 140 having a high computing and processing capacity, in which software has been stored that controls the various steps of the method of the invention and carries out the necessary computations. The same computer 140 may also operate as a computer that controls the entire papermaking process. The system of regulation includes devices 150 that effect the alarms concerning the condition of the wires and failure operations of the regulation system, these devices being connected to the rest of the regulation system through the operator control interface 135.

The optimal controller 130 has knowledge of the geometry of the former 100, receives information on the state of the former 100 by means of measurements and mechanical controls, and on the basis of these inputs, computes the overall flow state of the former 100 at each particular time. Starting from the basic equations of the flow, from the quality properties and profiles of the paper W, which can be measured either in an on-line process or from off-line paper, from the flow properties of the stock (consistency, composition, fiber length, etc.), the optimal controller 130 computes the set values for the instrumentation 105 and for the auxiliary devices of the former 100 in relation to the quality and production-cost target values set by the operator through the operator control interface 135 so as to accomplish a coordinated optimal flow state. Of the production costs, it is possible to mention, for example, the operating output. Of the quality quantities should be mentioned, for example, the formation, retention, and orientation level, all of which depend on the flow state of the former, which is obtained as a result of computing.

According to FIG. 2, as to its main principles, the system of regulation that makes use of the method of the present invention is a closed, feedback-connected system of regulation, whose "actual values" are the various quality properties and y-direction cross profiles of the paper web W coming from the papermaking process 200, and whose set values SW are formed in the unit 155, in which the information necessary for the operator is formed and displayed and reports are given on the paper W quality and on the production costs as well as the predictions based on simulation. On their basis, the instrumentation 105 of the former 100 is controlled by means of the optimal controller 130. The outer and wider regulation loop in the system of regulation in accordance with the present invention is a loop formed by the instrumentation 105 of the former 100, by the measurements M, by the optimal controller 130, by the transfer model 145, and by the set values SW, and the inner, narrower cycle of regulation is C→105→M→130.

On the other hand, in FIG. 2, the connection CAM between the blocks 100 and 105 represents the regulation signals $a_1, \ldots, a_6, b, c_1, \ldots, c_4$ illustrated in FIG. 1 and possible measurement signals, which are not needed necessarily and which are not illustrated in FIG. 1.

Also, in FIG. 2, as the block 60C51, a system of regulation and instrumentation of the headbox is illustrated, which system controls the headbox 60. The system 60CSI can be an overall system of regulation and optimization similar to that described in the current assignee's U.S. patent application Ser. No. 08/634,465.

The operation of the system of regulation sketched in FIG. 2 is based on the idea that the flows in the former 100 are illustrated as precisely as possible by means of a physical flow model, which is solved numerically by means of the computer 140.

An example of a physical flow model, which may also be considered a mathematical flow model, is represented by the Navier-Stokes equations (1) and (2):

$$\rho \frac{\partial \vec{u}}{\partial t} - \nabla \cdot [\mu(\nabla \vec{u} + \nabla \vec{u}^T)] + \rho(\vec{u} \cdot \nabla)\vec{u} + \nabla p = \rho \vec{f} \quad (1)$$

$$\nabla \cdot u = 0 \quad (2)$$

wherein $\vec{u}$ is the flow velocity, P is the static pressure, $\vec{f}$ is the volumetric force (e.g., gravitation, $\mu$ is the effective viscosity of flowing material, and $\rho$ is the density of the material.

For the fiber suspension flow in the former 100, besides for the fluid flow, equations are also needed for the dry solids and for the turbulence. It is a substantial feature of the physical flow model that the model is derived starting from basic equations of physics and not, for example, by fitting values that have been measured from the processes statistically into simple interdependencies or response models.

In the final part of the papermaking process 200, the properties of the paper W are measured on-line (block 120 in FIG. 2). Further, it is possible to make use of off-line laboratory measurements. The most important properties of paper W are, for example, the basis weight and fiber orientation profiles in the direction of width of the machine, i.e., in the cross direction y.

When the properties $R^p$ of paper W (p=paper) are known by means of measurements (block 120), and when the properties of the web after the former $R^f$ (f=former) are known by means of the flow model, based on these properties it is possible to form a transfer mapping T, i.e., the above transfer model for the effect of the papermaking process 200 on the property when moving from the former of FIG. 2 to finished paper W:

$$T: R^f \to R^p \quad (3)$$

The property R mentioned above is, for example, the moisture profile, i.e., $R^f$ is the numerically simulated volumetric proportion of water after the former, and $R^p$ is the measured moisture profile in the finished paper W.

The inverse mapping of this mapping is:

$$T^{-1}: R^p \to R^f \quad (4)$$

For the optimal controller 130, it must be defined what is aimed at (the overriding concern) in the optimizing process. Some of the most important aims of the stage of optimizing in the method of the present invention are the quality requirements of the paper W. When the inverse mapping of the transfer function T is known, by its means it is possible to set the targets for the former. For example, if an orientation profile $\theta^p(y)$ is desired for the paper, it is reported to the system of regulation that after the former the orientation profile must be $T^{-1}(\theta^p(y))=\theta^f(y)$. In a corresponding manner, a target basis weight profile of paper W is transferred to be the target basis weight profile of the former. Moreover, it can be set as a target to reach these quality requirements with minimal costs of operation of the paper machine.

The target of the stage of optimizing of the invention is written as a cost function. The cost function determines in a mathematical form how near or far the desired target is. Generally, the cost function is of the form:

$$F \sum_{k=1}^{n} w_k \|R^f_k - R^f_{k*}\| + \sum_{l=1}^{m} e_l \|E_l - E_l^*\| \quad (5)$$

wherein $R^f_k$ means the property $k=1, \ldots, n$ simulated by means of the flow model after the former, and $R^f_{k*}$ means the target property obtained by means of an inverse mapping from the properties of the paper in the former, i.e., $R^f_{k*} = T^{-1}(R^p)$. The weight function $w_k$ determines the relative weights of the different properties in the cost function. In the second part of the cost function, it has been produced as a pattern how close the other economical, energy-consumption or runnability targets $E_l$ are to the preset targets $E_{l*}$ as weighted with the target-specific weight coefficient $e_l (l=1, \ldots, m)$. Here the norm $\|X-X_*\|$ means the distance of the actual value X from the target $X_*$, which can be defined over a certain geometry, for example as the $L_2$-norm, i.e., integral of the second power of the difference:

$$\|X - X^*\| = \frac{1}{L} \int_0^L (X - X^*)^2 dy \quad (6)$$

The value of the cost function F depends on the solutions $S_k$ of the flow model of the former 100 which again depends on the set values of the regulation quantities $\vec{\alpha} = [\alpha_1, \ldots, \alpha_n]$ of the former 100. Thus, the cost function is obtained in the form:

$$F(S(\vec{\alpha})) = \sum_{k=1}^{n} w_k \|R^f_k(S(\vec{\alpha})) - T^{-1}_k(R^p)\| + \sum_{l=1}^{m} e_l \|E_l - E_l^*\| \quad (7)$$

The first part of the cost function to be optimized can also be formed directly for the quality requirements of paper W by using the pattern T, because $$\|R^f(S(\vec{\alpha})) - T^{-1}(R^p)\| = \|T(R^f(S(\vec{\alpha}))) - R^p\| \quad (8)$$

if and when the properties $R^p$ of the paper W can be represented sufficiently unequivocally by means of the properties $R^f$ of the web. In such a case, the weight coefficients of the cost function must be considered in relation to the properties $R^p$ of the paper W and not in relation to the properties $R^f$ of the web after the former, i.e., either (1) one moves from the properties of the paper W to the properties of the former by means of the inverse mapping $T^{-1}$ or (2) from the properties of the former to the properties of the paper W by means of the mapping T.

The purpose of the optimizing stage applied in the present invention is to minimize the cost function $(F(S(\vec{\alpha})))$ so that the solution $S(\vec{\alpha})$ carries into effect the flow model of the former 100 and that the values of the regulation variables $C = \vec{\alpha} = [\alpha_1, \ldots, \alpha_n]$ are included in the admissible regulation values.

On the other hand, if it is desirable to maximize some quantity, for example $E_g$, the norm $\|g(E_g)\|$ in respect of this property can always be written so that the value of the cost function reaches the minimum while the quantity $g(E_g)$ is maximized or while the quantity $-g(E_g)$ is minimized.

For the practical conditions, the operator may look for the best combinations of the weight coefficients $w_k$ and $e_l$ of the cost function (formula (5)) by using the flow model of the optimal regulator of the former and the transfer model 145 to simulate the effects of the combinations of different regulations and weight coefficients on the paper W that is being manufactured.

The stage of optimal regulation applied in the invention operates, for example, in accordance with the following algorithm (a corresponding flow diagram is given in the accompanying FIG. 3):

a. The necessary flow-rate, stock-grade and geometry data of the former 100 are read. The optimizing process is started from the default values $\vec{\alpha}^{(i)}$, i=0, and the value $F^{(i)}$ of the cost function is computed by solving the flow model of the former 100.

b. The gradient $\overline{\nabla F}^{(i)}$ of the cost function with the regulation values $\vec{\alpha}^{(i)}$ concerned is computed. The computation of the gradient (=sensitivity of the cost function in relation to the regulation) requires solution of the flow model of the former 100.

c. The direction $\vec{p}^{(i)}$ is determined which states in what direction the regulation quantities must be changed in order to lower the value of the cost function. At the simplest, the direction can be the direction $\vec{p}^{(i)} = -\overline{\nabla F}^{(i)}$ obtained by means of the gradient. This is what is called the gradient method, i.e., the steepest descent direction method. Other gradient-based methods are, for example, the conjugate gradient method and quasi-Newton's methods.

d. The new values of the regulation values $\vec{\alpha}^{(i+1)}$ are obtained by varying them in the direction $\vec{p}^{(i)}$ optimally.

$$\vec{\alpha}^{(i+1)} = \vec{\alpha}^{(i)} + \lambda^{(i)} \vec{p}^{(i)}, \quad (9)$$

i.e., the step length $\lambda^{(i)}$ is determined so that the cost function receives a lower value than with the preceding iteration, $F^{(i+1)} < F^{(i)}$, and the regulation quantities $\vec{\alpha}^{(i-1)}$ are admissible. In the search for a good step length, computing of the values of the cost function and, thus, solution of the flow model are required.

e. If the value of the cost function is not yet sufficiently low, an index for iteration step is increased, i=i+1, and optimizing is continued from point 1. In the opposite situation, optimizing is discontinued, and the values of optimal regulation quantities $C = \vec{\alpha}^{(i+1)}$ are transmitted to the regulation devices 105 of the former 100.

The examples provided above are not meant to be exclusive. Many other variations of the present invention would be obvious to those skilled in the art, and are contemplated to be within the scope of the appended claims.

We claim:

1. A method for optimizing the overall regulation of a former of a paper or board machine in which a pulp suspension flow is drained to produce paper, comprising the steps of:

(a) forming a physical fluid flow model of the drainage and flow state of the pulp suspension flow in the former;

(b) solving the flow model to obtain a simulated flow state based on data on the geometry of the former and initial and boundary conditions related to the former;

(c) obtaining a target flow state based on quality requirements of the paper;

(d) determining a difference between the simulated flow state obtained as the solution of the flow model and the target flow state, the difference constituting a cost function;

(e) optimizing the cost function and then determining optimal regulation values and set values for regulation devices and actuators which affect the drainage and flow state of the pulp suspension flow in the former in view of the cost function; and (f) providing the optimal regulation values and set values to the regulation devices and actuators of the former such that the regulation devices and actuators operate at the optimal regulation values and set values to thereby realize the optimization of the cost function.

2. The method of claim 1, wherein the step of forming the flow model comprises the steps of:

forming the flow model on the basis of fluid dynamics relationships or on the basis of simplified equations derived from fluid dynamics relationships which are solved numerically by means of a computer, and utilizing on-line and/or laboratory measurements and information provided by an operator of the paper machine to obtain the initial and boundary conditions of the flow model.

3. The method of claim 1, further comprising the steps of:

computing a plurality of flow states by means of a physical model, adapting a statistical model from the plurality of flow states to illustrate the flow state of the former and/or the dependency of the cost function on the regulation quantities, or instructing a neural network to illustrate the flow state of the former and/or the dependency of the cost function on the regulation quantities from the plurality of flow states, and utilizing the statistical model or the neural network for optimizing the cost function.

4. The method of claim 1, wherein the step of solving the flow model comprises the steps of:

using a computer having a high computing and processing capacity and comprising at least one processor, and directing the computer to use numerical methods of solution.

5. The method of claim 4, further comprising the step of selecting the numerical methods of solution from the group consisting of finite-element, finite-difference and finite-volume methods.

6. The method of claim 1, wherein the step of optimizing the cost function and then determining optimal values for the regulation devices and actuators of the former is carried out in accordance with the following algorithm:

(a.) the necessary flow-rate, stock-grade and geometry data of the former are read, and the optimizing is started from the default values $\vec{\alpha}^{(i)}$, i=0, and the value $F^{(i)}$ of the cost function is computed by solving the flow model of the former, (b.) the gradient $\nabla F^{(i)}$ of the cost function with the regulation values $\vec{\alpha}^{(i)}$ concerned is computed, (c.) the direction $\vec{p}^{(i)}$ is determined by means of the gradient $\nabla F^{(i)}$, which direction indicates the direction the regulation values must change in order to lower the value of the cost function, the sensitivity of the cost function F in relation to the regulation quantity $\alpha_k$ being computed by means of the difference quotient $$\frac{\partial}{\partial_k} F = \frac{F(\alpha_k + \epsilon) - F(\alpha_k)}{\epsilon}$$

or by solving the adjoint state equation corresponding to the flow model of the former, (d.) the new values of the regulation quantities (C) are determined by varying them in the direction determined in the preceding step (c.) optimally $$\vec{\alpha}^{(i+1)} = \vec{\alpha}^{(i)} + \lambda^{(i)} \vec{p}^{(i)}$$

in which connection the step length $\lambda^{(i)}$ is determined so that the cost function receives a lower value than with the preceding iteration, $F^{(i+1)} < F^{(i)}$, and the regulation quantities (C) are admissible, and (e.) if the value of the cost function obtained in the preceding steps is not yet sufficiently low, an index for iteration step is increased, i=i+b 1, and optimizing is continued from the above stage (b.), and in the contrary case, performing of the algorithm is discontinued, and the optimal values of the regulation devices and actuators are set equal to the optimized regulation quantities (C) and they are transmitted to the regulation devices and actuators of the former.

7. The method of claim 1, wherein the step of optimizing the cost function is determined by an algorithm and is not based on computing the gradient of the cost function.

8. The method of claim 1, further comprising the step of selecting the measurement and regulation quantities of the former to be regulated from the group consisting of the state of the pulp suspension jet coming from a headbox of the paper or board machine, the running speed and tensions of forming wires in the former, the vacuum levels in water drain elements in the former, the location, loading and/or position of the water drain elements in the former, and the covering angle on a former roll in the former about which the web is passed.

9. The method of claim 1, wherein the cost function comprises at least the target profiles of finished paper, the target profiles being the basis weight and fiber-orientation profile, or out of values computed from these profiles.

10. The method of claim 9, wherein besides the target profiles, the cost function also comprises components related to the runnability and/or energy consumption of the paper machine.

11. The method of claim 1, further comprising the step of selecting a quality level for the finished paper and determining the lowest possible energy consumption by minimizing consumption of jet waters and wear of wires and water drain elements.

12. The method of claim 1, further comprising the step of weighting different parts of the cost function, the parts being the quality of the paper, the runnability of the machine and the energy consumption of the machine.

13. The method of claim 12, wherein the quality of the paper is set as the most important part, and the runnability is improved and/or energy saved vis-a-vis the cost function only if a deterioration in the quality of the paper does not occur.

14. The method of claim 1, wherein the cost function includes quality quantities which are expressed by means of the properties of the web after the former.

15. The method of claim 1, wherein the step of solving the flow model comprises the steps of:

using a computer having a high computing capacity and comprising at least one processor, and increasing the speed in which the computer solves the flow model by performing the computations in parallel.

16. The method of claim 15, wherein the computer comprises a plurality of processors and the speed of the computer is increased by computing each of the sensitivities of changes in the cost function in relation to different regulation devices of the former by means of a separate processor in the computer.

17. The method of claim 16, wherein the sensitivities of the cost function in relation to different regulation devices are determined by means of a sensitivity analysis carried out in an environment of linearized solution so that the flow model is solved by means of a perturbation theory by determining the gradient of the cost function, wherein for the optimization of the cost function, in other respects, a real non-linear model is used such that the optimization proper is based on a real flow model, and any faults arising from the perturbation theory do not have a substantial effect on the final result of the optimization.

18. The method of claim 1, wherein the step of solving the flow model comprises the steps of:
composing the flow model of the former from several sub-models,
simultaneously solving each of the sub-models by means of a respective processor of a computer, and
directing data from each of the processors to other ones of the processors.

19. The method of claim 1, wherein the step of solving the flow model comprises the step of:
using a computer; and
enhanced the ability of the computer by dividing the optimizing into parts so that the regulation quantities that have the greatest effect on the quality of the finished paper are optimized more frequently while reacting to the changes rapidly, whereas other regulation quantities are optimized less frequently, and that for optimizing of the regulation quantities for which the whole flow model is not needed a suitable sub-model is used.

20. The method of claim 1, wherein the former includes forming rolls, an MB-unit, forming shoes and/or suction flatboxes, water drain elements including loadable forming ribs, and a pair of forming wires for carrying a web formed therethrough, further comprising the step of:
regulating at least one of the vacuum levels in the forming rolls, the position of the forming rolls, the operation of the MB-unit, the operation of the forming shoes, the operation of the suction flatboxes, the position of the forming ribs, the loading forces applied to the forming ribs, the position of the water drain elements, the tension of the forming wires, the retention of the pulp suspension jet and the retention profile of the pulp suspension jet in a direct transverse to the flow direction in accordance with the optimization of the cost function.

21. The method of claim 1, further comprising the steps of:
forming the physical fluid flow model for a grade of paper different than the grade being produced from the pulp suspension flow so that optimal regulation values and set values are obtained for the new grade of paper.

22. The method of claim 1, further comprising the steps of:
forming the pulp suspension flow by directing a slice jet from a headbox of the paper or board machine,
regulating the headbox to optimize its operation.

23. The method of claim 1, further comprising the step of:
controlling at least one of the cross-direction basis weight profile and fiber orientation profile of a web produced from the drained pulp suspension flow.

24. The method of claim 1, wherein the target flow state is also obtained based on the costs of operation and runnability of the paper machine.

* * * * *